(12) United States Patent
Kang

(10) Patent No.: US 6,909,177 B2
(45) Date of Patent: Jun. 21, 2005

(54) CHIP CARRIER PLATE

(75) Inventor: Heng-Hwa Kang, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/747,771

(22) Filed: Dec. 29, 2003

(65) Prior Publication Data

US 2004/0232546 A1 Nov. 25, 2004

(30) Foreign Application Priority Data

May 20, 2003 (TW) .......................... 92113538 A

(51) Int. Cl.[7] .................. H01L 23/12; H01L 23/10
(52) U.S. Cl. ............................. 257/711; 257/710
(58) Field of Search ............................. 257/704, 700, 257/710, 711, 701; 206/710, 711, 714, 712, 726, 728

(56) References Cited

U.S. PATENT DOCUMENTS

| 4,654,693 A | * | 3/1987 | Funakoshi et al. | 269/287 |
| 5,666,064 A | * | 9/1997 | Kasai et al. | 324/755 |
| 6,079,565 A | * | 6/2000 | Walsh et al. | 206/725 |
| 6,573,121 B2 | * | 6/2003 | Yoneda et al. | 438/106 |
| 2002/0158646 A1 | * | 10/2002 | DiFrancesco | 324/761 |

FOREIGN PATENT DOCUMENTS

JP 08-011930 1/1996

* cited by examiner

Primary Examiner—S. V. Clark
(74) Attorney, Agent, or Firm—Thomas, Kayden, Horstemeyer & Risley

(57) ABSTRACT

A chip carrier plate. The chip carrier plate comprises a base, a protruding face, and a receiving face. The protruding face is disposed on the base. The receiving face is formed on another side of the base opposite to the protruding face. A plurality of recesses is formed on the protruding face. Each recess has a first spacer and a second spacer disposed on the bottom surface therein.

6 Claims, 6 Drawing Sheets

CHIP CARRIER PLATE

BACKGROUND OF THE INVENTION

1. Field of the Invention

The present invention relates to a chip carrier plate, and in particular to a chip carrier plate that carries a LCD driver chip.

2. Description of the Related Art

In LCD display fabrication, driver chips are carried by a chip carrier plate. FIGS. 1a and 1b show a conventional chip carrier plate 100, which comprises a base 101, a protruding face 102, and a receiving face 103. A plurality of recesses 110 is formed in the protruding face 102 to hold chips.

A plurality of chip carrier plates stacked for transport by aligning the protruding face 102 with the receiving face 103. The protruding face 102 of the chip carrier plate is connected to the receiving face 103 of another chip carrier plate to prevent slippage.

FIG. 2 shows a chip 120 placed in the recess 110. Gold bumps 121 of the chip 120 contact the bottom of the recess 110. Frequently, however, particles are present on the surface or in the recesses of the chip carrier plate and may stick to and damage the chip. Thus, reducing chip reliability.

Particles accumulation occurs for several reasons, including the following. Particles may fall from the robot operator which holds the chip onto the carrier plate, or may remain as a result of chip fabrication. Due to the variety of sources, chip pollution by particle accumulation is difficult to prevent.

SUMMARY OF THE INVENTION

Thus, there is a need to provide a chip carrier plate preventing chip contact with residual particles.

The chip carrier plate of the present invention has a base, a protruding face, and a receiving face. The protruding face is disposed on the base. The receiving face is formed on another side of the base opposite to the protruding face. A plurality of recesses is formed in the protruding face. Each recess has a first spacer and a second spacer disposed on the bottom surface therein.

The present invention reduces the possibility of chip contact with the particles to prevent chip damage and increasing the reliability of the finished products.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
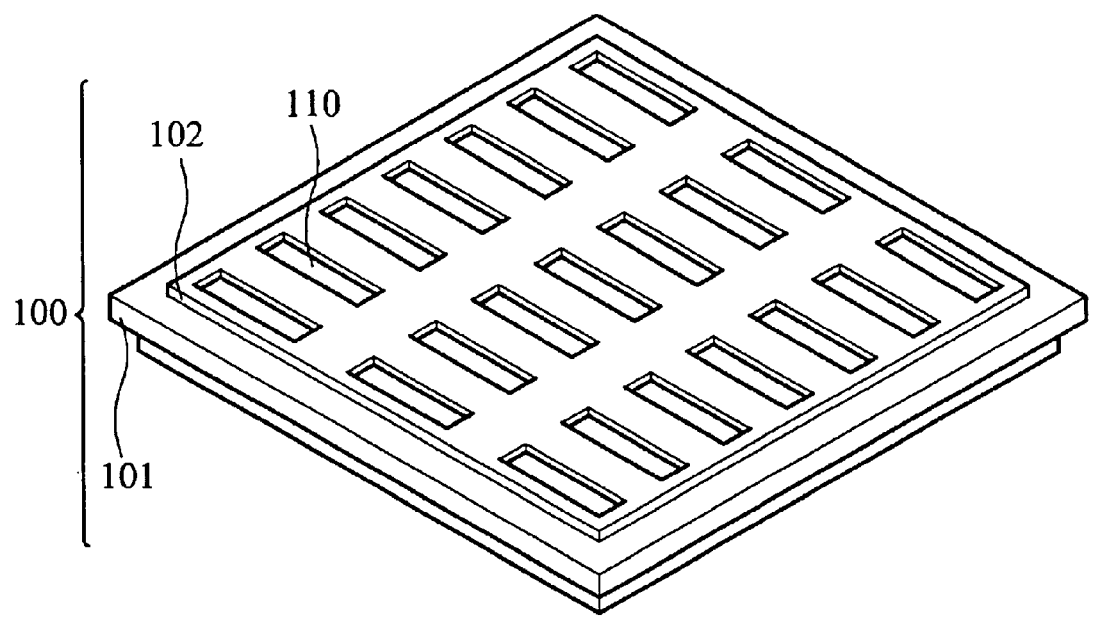
FIG. 1a shows a conventional chip carrier plate.
Figure 1B:
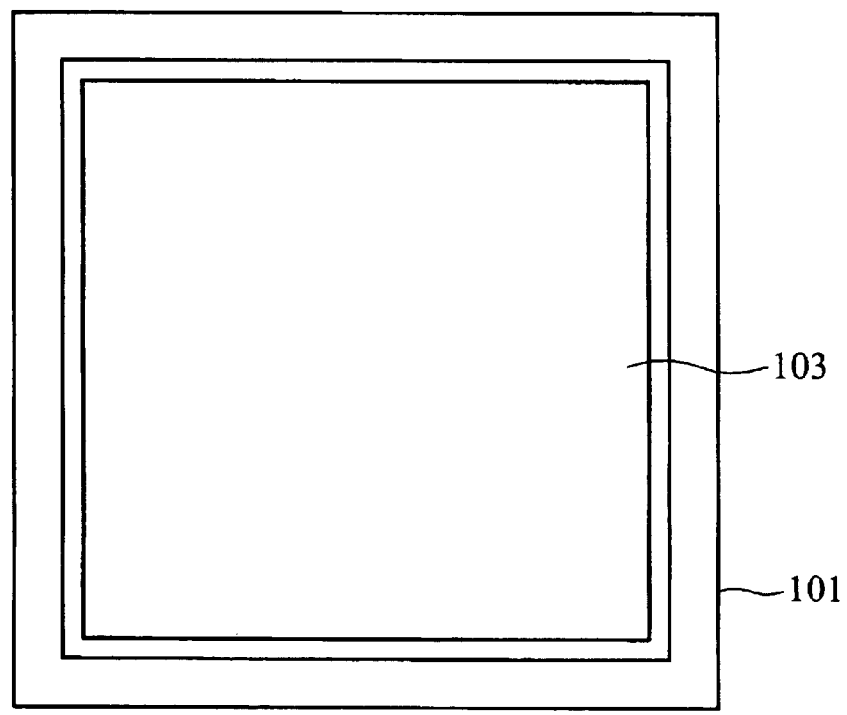
FIG. 1b is a bottom view of the conventional chip carrier plate.
Figure 2:
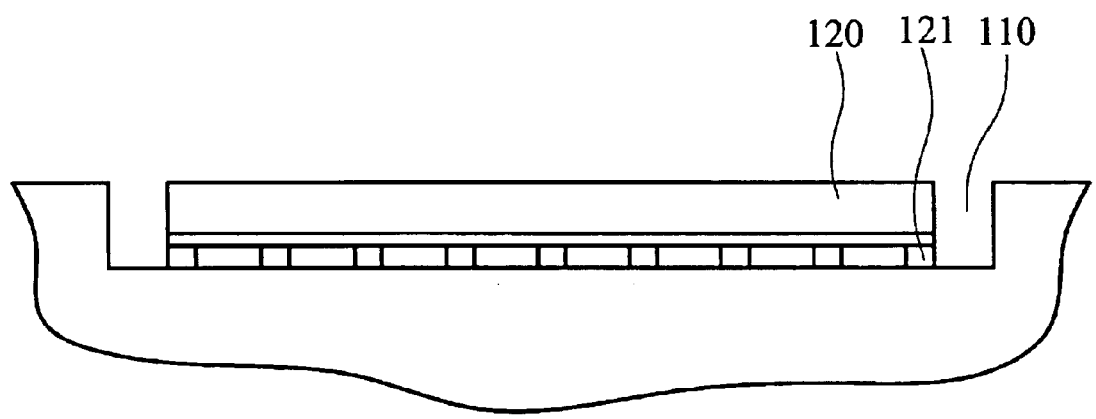
FIG. 2 shows a chip placed in a recess of the conventional chip carrier plate.
Figure 3A:
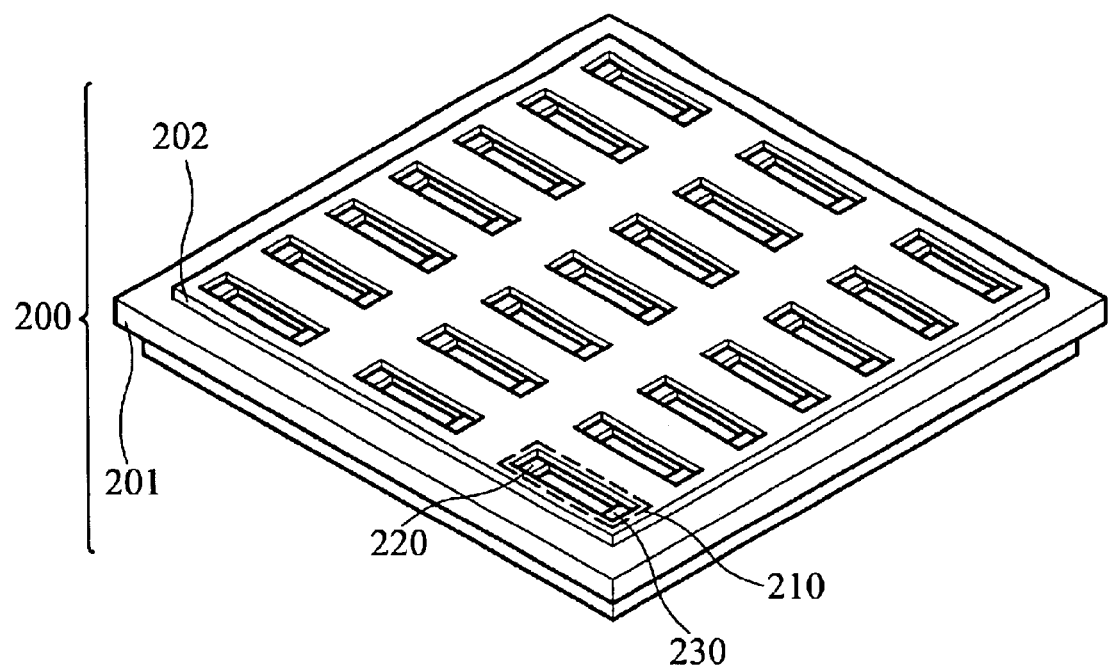
FIG. 3a shows the first embodiment of the present invention.
Figure 3B:
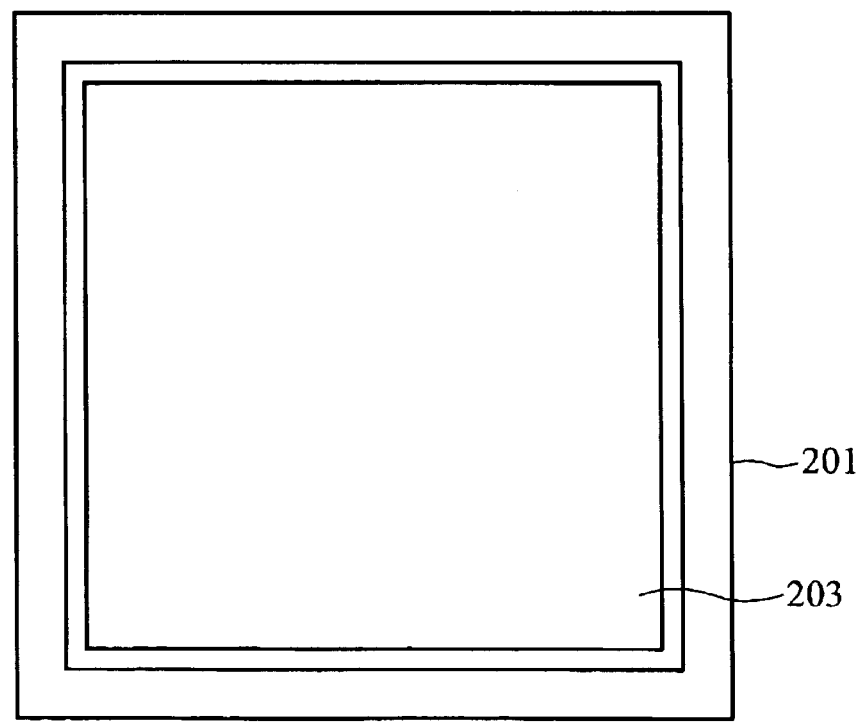
FIG. 3b is a bottom view of the first embodiment.

FIGS. 3a and 3b show the first embodiment of the present invention. The chip carrier plate 200 of the present invention comprises a base 201, a protruding face 202 and a receiving face 203. The protruding face 202 is disposed on the base 201. The receiving face 203 is formed on another side of the base 201 opposite to the protruding face 202. A plurality of recesses 210 is formed on the protruding face 202. Each recess 210 has a first spacer (first protrusion) 220 and a second spacer (second protrusion) 230 disposed on the bottom surface therein.

A plurality of chip carrier plates 200 is stacked for transport by aligning the protruding face 202 and the receiving face 203. The protruding face 202 of a chip carrier plate is connected to the receiving face 203 of another chip carrier plate 200 to prevent slippage of the chip carrier plates 200.

Figure 4:
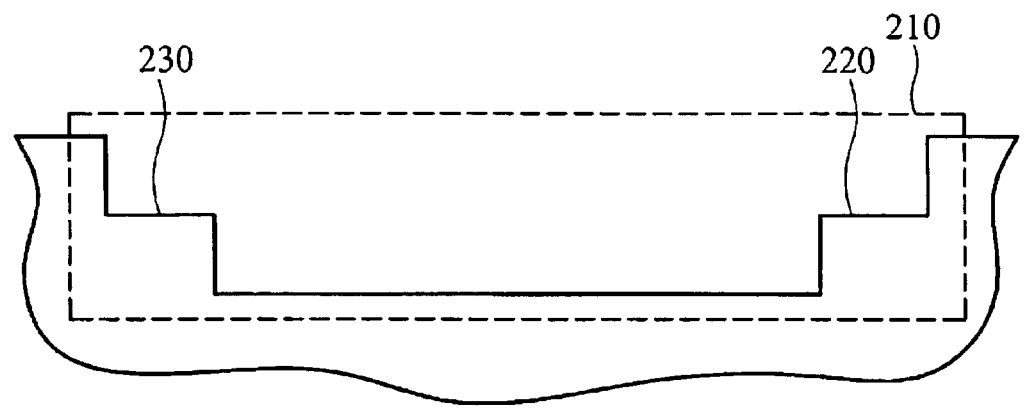
FIG. 4 shows a recess of the first embodiment.

FIG. 4 is a cross-sectional view of the recess 210. The first spacer 220 and the second spacer 230 are disposed on opposing sides of the bottom of the recess 210.

Figure 5:
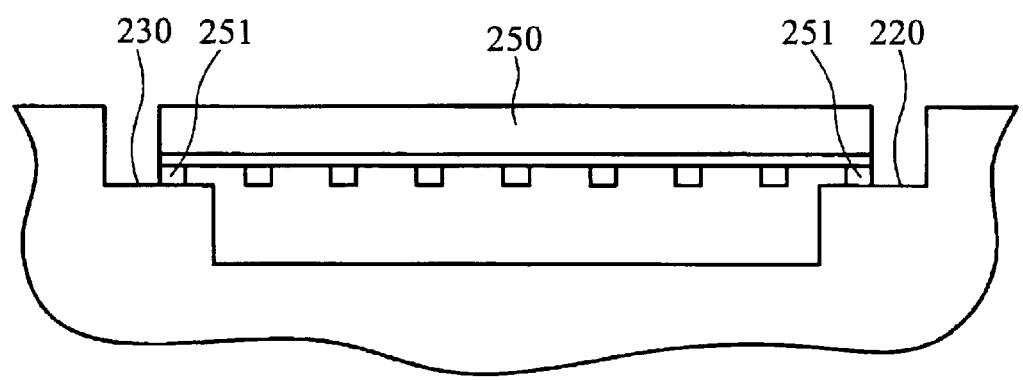
FIG. 5 shows a chip placed in the recess of the first embodiment.

Referring to FIG. 5, when a chip 250 is placed in the recess 210, gold bumps 251 contact the first spacer 220 and the second spacer 230.

Figure 6:
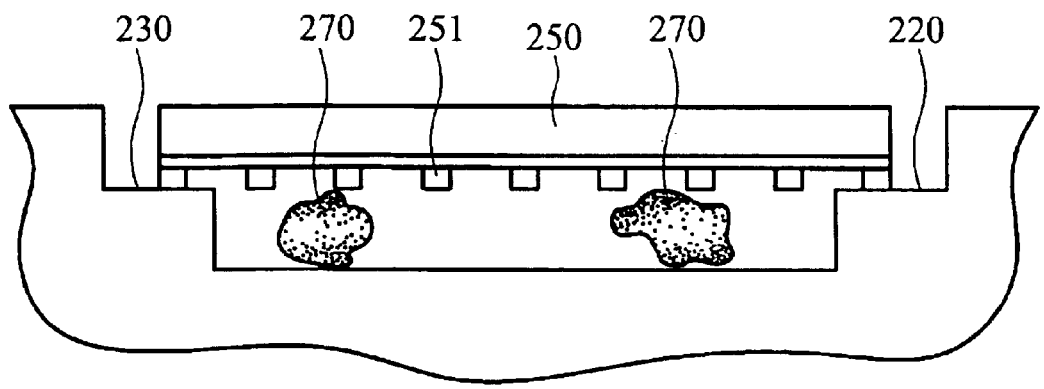
FIG. 6 shows a chip placed in the recess of the first embodiment with particles in the recess.

As shown in FIG. 6, when particles 270 fall on the surface of the chip carrier plate, they may accumulate in the gap between the first spacer 220 and the second spacer 230. Thus, by maintaining a gap, the spacers of the present invention reduce the possibility of contact between chip 250 and particles 270.

The heights of the first spacer 220 and the second spacer 230 are designed according to potential particle size. The heights of the first spacer 220 and the second spacer 230 are between 50 $\mu$m and 1000 $\mu$m.

Figure 7:
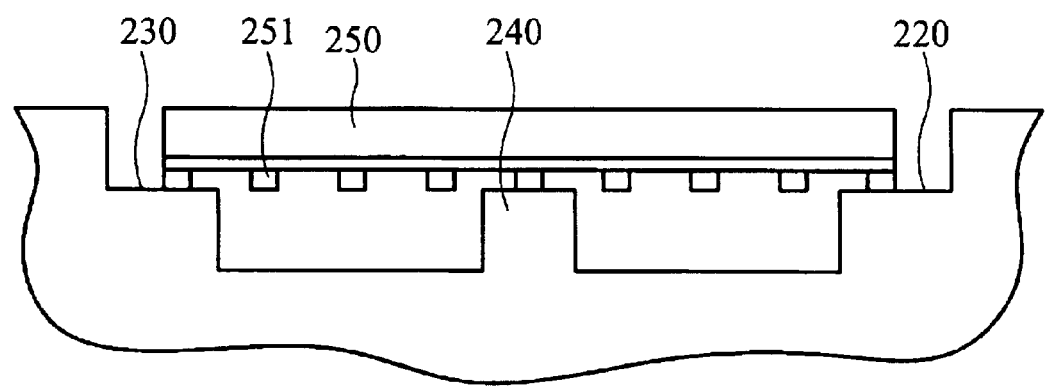
FIG. 7 shows a chip placed in the recess of the second embodiment.

FIG. 7 shows a second embodiment of the present invention, which has a third spacer 240, disposed between the first spacer 220 and the second spacer 230. The third spacer (third protrusion) 240 contacts the gold bumps 251 of the chip 250 to prevent deformation of chip 250.

Figure 8:
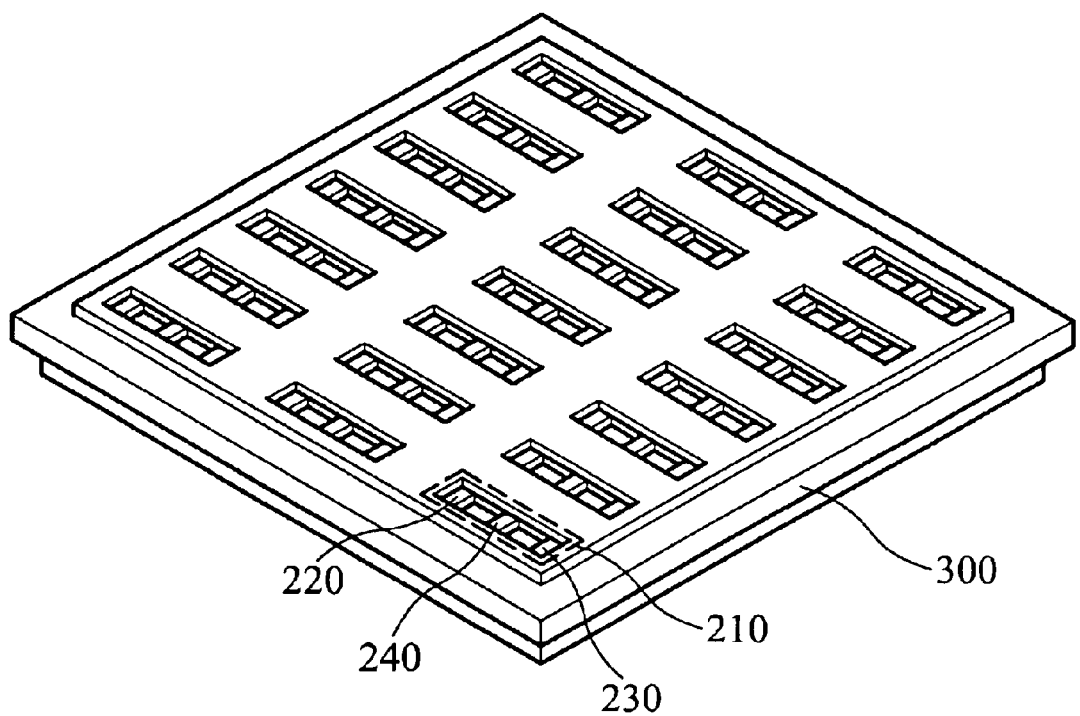
FIG. 8 shows the second embodiment of the present invention.

FIG. 8 shows the chip carrier plate with the third spacer 240.

The third spacer 240 mentioned above also has a height between 50 $\mu$m and 1000 $\mu$m.

The present invention decreases the possibility of the chip contacting with the particles, thus, preventing chip damage, and increasing reliability of the finished products.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip carrier plate for carrying a chip, comprising:
   a recess;
   a first spacer, disposed in the recess, supporting a side of the chip; and a second spacer, disposed in the recess, supporting another side of the chip;

wherein the height of the first spacer is between 50 µm and 1000 µm.

2. A chip carrier plate for carrying a chip, comprising:

a recess;

a first spacer, disposed in the recess, supporting a side of the chip; and a second spacer, disposed in the recess, supporting another side of the chip;

wherein the height of the second spacer is between 50 µm to 1000 µm.

3. A chip carrier plate for carrying a chip, comprising:

a recess;

a first spacer, disposed in the recess, supporting a side of the chip;

a second spacer, disposed in the recess, supporting another side of the chip; and a third spacer, disposed between the first spacer and the second spacer, and contacting with the chip.

4. The chip carrier plate as claimed in claim 3, wherein the height of the third spacer is between 50 µm to 1000 µm.

5. A chip carrier plate for carrying a chip, comprising:

a recess;

a first protrusion, disposed in the recess, supporting a side of the chip; and a second protrusion, disposed in the recess, supporting another side of the chip, the first protrusion and the second protrusion are disposed on opposing sides of the bottom of the recess; and a third protrusion, disposed between the first protrusion and the second protrusion, and contacting the chip.

6. The chip carrier plate as claimed in claim 5, further comprising:

a base;

a protruding face disposed on the base; and a receiving face formed on the base opposite the protruding face, wherein the recess is formed on the protruding face.

* * * * *